United States Patent
Amkreutz et al.

(10) Patent No.: US 10,074,758 B2
(45) Date of Patent: Sep. 11, 2018

(54) BACK-CONTACT SI THIN-FILM SOLAR CELL

(71) Applicant: HELMHOLTZ-ZENTRUM FÜR MATERIALIEN UND ENERGIE GMBH, Berlin (DE)

(72) Inventors: Daniel Amkreutz, Berlin (DE); Jan Haschke, Neuchatel (CH); Bernd Rech, Berlin (DE)

(73) Assignee: HELMHOLTZ-ZENTRUM BERLIN FUER MATERIALIEN UND ENERGIE GMBH, Berlin (DE)

( * ) Notice: Subject to any disclaimer, the term of this patent is extended or adjusted under 35 U.S.C. 154(b) by 0 days.

(21) Appl. No.: 15/121,777

(22) PCT Filed: Mar. 4, 2015

(86) PCT No.: PCT/DE2015/100085
§ 371 (c)(1),
(2) Date: Aug. 26, 2016

(87) PCT Pub. No.: WO2015/131881
PCT Pub. Date: Sep. 11, 2015

(65) Prior Publication Data
US 2017/0018668 A1  Jan. 19, 2017

(30) Foreign Application Priority Data
Mar. 4, 2014 (DE) .................. 10 2014 102 864

(51) Int. Cl.
*H01L 31/0392* (2006.01)
*H01L 31/0445* (2014.01)
(Continued)

(52) U.S. Cl.
CPC .... *H01L 31/03921* (2013.01); *H01L 31/0288* (2013.01); *H01L 31/02167* (2013.01);
(Continued)

(58) Field of Classification Search
CPC .......... H01L 31/03921; H01L 31/0445; H01L 31/02167; H01L 31/02168;
(Continued)

(56) References Cited

U.S. PATENT DOCUMENTS

| 5,066,340 A | 11/1991 | Iwamoto et al. |
| 2009/0014063 A1 | 1/2009 | Stangl et al. |
| 2012/0018733 A1 | 1/2012 | Prabhakar |

FOREIGN PATENT DOCUMENTS

| DE | 4025311 A1 | 2/1991 |
| DE | 202005019799 U1 | 3/2006 |

(Continued)

OTHER PUBLICATIONS

S. Varlamov, et al., "Polycrystalline silicon on glass thin-film solar cells: A transition from solid-phase to liquid-phase crystallized silicon",Solar Energy Materials & Solar Cells 119, Dec. 2013, pp. 246-255.
(Continued)

*Primary Examiner* — Matthew T Martin
(74) *Attorney, Agent, or Firm* — Leydig, Voit & Mayer, Ltd.

(57) ABSTRACT

A back-contact Si thin-film solar cell includes a crystalline Si absorber layer and an emitter layer arranged on the crystalline Si absorber layer, which include a contact system being arranged on the back so as to collect excess charge carriers generated by the incidence of light in the absorber layer; a barrier layer having a layer thickness in a range of from 50 nm to 1 μm formed on a glass substrate; at least one coating layer intended for optical coating; and thin layer containing silicon and/or oxygen adjoining the crystalline Si absorber layer arranged on the at least one coating layer for improving the optical characteristics. The crystalline Si absorber layer can be produced by means of liquid-phase crystallization, is n-conducting, and has monocrystalline Si
(Continued)

grains. An SiO2 passivation layer is formed between the layer containing silicon and/or oxygen and the Si absorber layer during the liquid-phase crystallization.

10 Claims, 1 Drawing Sheet

(51) Int. Cl.
*H01L 31/0352* (2006.01)
*H01L 31/0216* (2014.01)
*H01L 31/20* (2006.01)
*H01L 31/0368* (2006.01)
*H01L 31/0747* (2012.01)
*H01L 31/18* (2006.01)
*H01L 31/0224* (2006.01)
*H01L 31/0288* (2006.01)

(52) U.S. Cl.
CPC .......... *H01L 31/02168* (2013.01); *H01L 31/022441* (2013.01); *H01L 31/03529* (2013.01); *H01L 31/03682* (2013.01); *H01L 31/0445* (2014.12); *H01L 31/0747* (2013.01); *H01L 31/182* (2013.01); *H01L 31/1824* (2013.01); *H01L 31/1868* (2013.01); *H01L 31/1872* (2013.01); *H01L 31/202* (2013.01); *Y02E 10/546* (2013.01); *Y02P 70/521* (2015.11)

(58) Field of Classification Search
CPC ......... H01L 31/022421; H01L 31/0288; H01L 31/03529; H01L 31/03682; H01L 31/0747; H01L 31/182; H01L 31/1824; H01L 31/1868; H01L 31/1872; H01L 31/202

USPC ........................................................ 136/256
See application file for complete search history.

(56) References Cited

FOREIGN PATENT DOCUMENTS

| DE | 102005025125 B4 | 5/2008 |
| DE | 102010007695 A1 | 8/2011 |
| DE | 102012004314 A1 | 8/2013 |
| DE | 102014102864 A1 | 9/2015 |

OTHER PUBLICATIONS

Gudrun Andrae, et al., "Multicrystalline silicon thin film solar cells based on a two-step liquid phase laser crystallization process", Thin Solid Films, vol. 562, Jul. 1, 2014, pp. 430-434.

J. Dore, et al., "Performance potential of low-defect density silicon thin-film solar cells obtained by electron beam evaporation and laser crystallization", EPJ Photovoltaics, vol. 4, Jan. 11, 2013 (Jan. 11, 2013), pp. 40301, XP055199467.

Amkreutz D. et al., "Conversion efficiency and process stability improvement of electron beam crystallized thin film silicon solar cells on glass", Solar Energy Materials and Solar Cells, vol. 123, Jan. 17, 2014 (Jan. 17, 2014), pp. 13-16, XP028615841.

Haschke J . et al., "Polycrystalline silicon heterojunction thin-film solar cells on glass exhibiting 582mV open-circuit voltage", Solar Energy Materials and Solar Cells, Elsevier Science Publishers, Amsterdam, NL, vol. 115, Apr. 12, 2013 (Apr. 12, 2013), pp. 7-10, XP028553516.

R. Stangl, et al., "Planar rear emitter back contact amorphous/ crystalline silicon heterojunction solar cells (Recash/Precash)", 2008 33$^{rd}$ IEEE Photovoltaic Specialists Conference, May 1, 2008 (May 1, 2008), pp. 1-6, XP055079124.

BACK-CONTACT SI THIN-FILM SOLAR CELL

CROSS REFERENCE TO RELATED APPLICATIONS

This application is a U.S. National Stage Application under 35 U.S.C. § 371 of International Application No. PCT/DE2015/100085 filed on Mar. 4, 2015, and claims benefit to German Patent Application No. DE 10 2014 102 864.3 filed on Mar. 4, 2014. The International Application was published in German on Sep. 11, 2015 as WO 2015/131881 A2 under PCT Article 21(2).

FIELD

The invention relates to back-contact Si thin-film solar cells having a crystalline Si absorber layer and an emitter layer arranged on the crystalline Si absorber layer, which consist of semiconductor materials.

BACKGROUND

In the case of solar cells contacted on one side, both contact systems are arranged on one side for the out-flow of charge carriers generated by incident light at the junction of two semiconductor materials of different conductivity (absorber and emitter). The charge carriers are separated at the p-n junction between the emitter layer and the absorber layer and are delivered to the corresponding contact system. In the case of back-contacting, shading losses are avoided by a contact system, and therefore the efficiency of the solar cell is increased. Moreover, it is possible to provide further functional layers on the side of the solar cell facing the incident light.

By comparison with wafer-based solar cells, thin-film solar cells only require a fraction of the amount of semiconductor material and can be applied directly to an inexpensive glass substrate. It can be seen from most publications from the prior art that an Si absorber layer which is p-conductive is applied to a glass substrate by means of liquid-phase crystallization (see for example Amkreutz et al. in Solar Energy Materials & Solar Cells 123 (2014) 13-16; Haschke et al. in Solar Energy Materials & Solar Cells 115 (2013) 7-10; Dore et al. in EPJ Photovoltaics 4, 40301 (2013)), since this conductivity type is supported by the contaminants diffusing out of the glass substrate in the further method steps, in particular also by the liquid-phase recrystallization of an amorphous or nanocrystalline silicon layer. Likewise, a p-conductive absorber layer is also described in the thin-film solar cells proposed in DE 40 25 311 A1 or in DE 20 2005 019 799 U1. However, all these known arrangements according to the prior art do not achieve open circuit voltages of >600 mV.

Various contacting systems for back-contact Si thin-film solar cells are described in both DE 2005 025 125 B4 and DE 10 2010 007 695 A1. These solar cells have at least one absorber layer and an emitter layer arranged on the back which consist of semiconductor materials of opposite p- and n-type doping. Furthermore, a passivation/covering/anti-reflection layer on the side of the incidence of light is described in DE 2005 025 125 B4 for the thin-film solar cell. A buffer layer (a-Si:H) covering the contact structure on the back is provided on the opposite side of the absorber, i.e. the side facing away from the incidence of light, in order to improve the passivation of the interface between the emitter and the absorber.

SUMMARY

In an embodiment, the present invention provides a back-contact Si thin-film solar cell comprising a crystalline Si absorber layer and an emitter layer arranged on the crystalline Si absorber layer, the layer including semiconductor materials of opposite p- and n-type doping, a contact system being arranged on a back thereof so as to collect excess charge carriers generated by the incidence of light in the absorber layer; a barrier layer having a layer thickness in a range of from 50 nm to 1 µm formed on a glass substrate; at least one coating layer intended for optical coating having a layer thickness of 40 nm to 250 nm arranged on the barrier layer; and a 0.5 nm to 20 nm thin layer containing silicon and/or oxygen adjoining the crystalline Si absorber layer arranged on the at least one coating layer for improving the optical characteristics. The crystalline Si absorber layer is produceable by liquid-phase crystallization, is n-conducting, has a layer thickness of between 200 nm and 40 µm, has homogenous doping of between $2·10^{15}$ cm$^{-3}$ and $5·10^{18}$ cm$^{-3}$ over an entire thickness thereof, and has monocrystalline Si grains, an extension thereof being at least as great as the thickness of the absorber layer. During the liquid-phase crystallization an SiO2 passivation layer is formed between the layer containing silicon and/or oxygen and the Si absorber layer.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
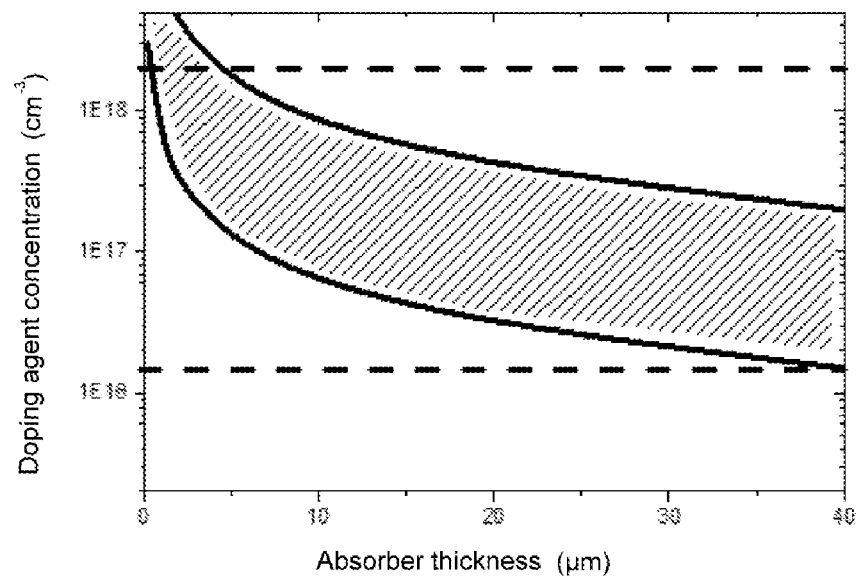
FIG. 1 depicts doping concentrations of an absorber layer for a selected parameter range according to embodiments of the invention.

As a development of the contacting system described in DE 2005 025 125 B4, as shown in DE 10 2010 007 695 A1, an embodiment of the present invention provides a thin-film solar cell with an intrinsically conductive passivation layer (a-Si:H, intrinsic) between an absorber layer and an emitter layer arranged on the back. Embodiments of the invention provide a back-contact Si thin-film solar cell having improved parameters by comparison with the aforementioned prior art, in particular an increased open circuit voltage, and a method for producing a back-contact Si thin-film solar cell of this type.

Embodiments of the invention include a barrier layer, which is intended to prevent the diffusion of contaminants out of the substrate into the following layers, arranged on a glass substrate. The barrier layer is formed of $SiO_x$, $SiN_x$, $SiC_x$, $TiO_2$, $AlO_x$ or the mixed alloys thereof (for example: $Si_xO_yN$, $Si_xO_yC$) individually or in multiple layers, and has an overall layer thickness in the range of from 50 nm to 1 µm depending on its index of refraction. At least one optical coating layer (for reducing the reflectivity) is arranged on the barrier layer. This layer is formed of $SiN_x$, $SiO_x$, $SiC_x$, $TiO_2$, $AlO_x$ or the mixed alloys thereof (for example: $Si_xO_yN$, $Si_xO_yC$), has an overall layer thickness of from 20 nm to 250 nm and has an index of refraction which differs from that of the substrate, the barrier layer and the semiconductor material. A 0.5 nm to 20 nm thin layer containing silicon and/or oxygen is arranged on the side of the coating layer facing away from the incidence of light, directly adjoining the crystalline Si absorber layer. The crystalline Si absorber layer can be produced by a liquid-phase crystallization process, is n-conducting, has a layer thickness of between 200 nm and 40 μm and has a homogeneous doping of between $2 \cdot 10^{15}$ $cm^{-3}$ and $5 \cdot 10^{18}$ $cm^{-3}$ over the entire thickness. Moreover, monocrystalline Si grains, the extension of which is at least as great as the thickness of the absorber layer, are formed in the thin n-conducting Si absorber layer. During the liquid-phase crystallization, a very thin $SiO_2$ passivation layer is formed between the layer containing silicon and/or oxygen and the absorber layer.

Embodiments of the invention include an n-conducting crystalline Si absorber layer. The formation of a very thin $SiO_2$ layer during the liquid-phase crystallization process of the Si layer is exploited when melting the amorphous or nanocrystalline Si layer and a layer which is arranged therebelow and contains at least oxygen. The formation of this thin $SiO_2$ layer means that it is unnecessary to apply an n+ doped front drift field as is known from the prior art.

The combination of the aforementioned features and their action with the other layers mentioned provides an open circuit voltage that has not yet been achieved by the prior art. The doping concentration in the stated range results in a higher transverse conductivity in the absorber layer, and therefore the horizontal current transmission in the solar cell according to the invention is improved. This has a positive on effect on the fill factor and the achievable open circuit voltage of the solar cell. Furthermore, the arrangement according to the invention ensures good passivation of the side of the absorber layer facing the glass substrate, and therefore recombination losses are reduced.

In an embodiment, the homogeneous doping of the n-conducting crystalline Si absorber layer is $1.5 \cdot 10^{16}$ $cm^{-3}$ to $2 \cdot 10^{18}$ $cm^{-3}$ over the entire thickness thereof. The doping concentration $N_D$ can be determined by means of comparison measurements and simulation calculations for arrangements according to the invention using the formula $N_D = c_0 \cdot 1/d$, where d designates the thickness of the absorber layer in micrometers, which is between 200 nm and 40 μm, and where $c_0$ represents an areal doping, the value of which is in a range of between $6 \cdot 10^{17}$ $\mu m \cdot cm^{-3}$ and $8 \cdot 10^{18}$ $\mu m \cdot cm^{-3}$.

Owing to the formation according to an embodiment the invention of the thin n-conducting crystalline Si absorber layer, an absorber layer having a sufficiently good electronic quality can be achieved, i.e. the effective bulk diffusion length of the minority charge carriers is substantially greater than the layer thickness of the absorber layer. This ensures an effective collection of charge carriers.

After the surface of the generated n-conducting Si absorber layer has been cleaned, an a-Si:H(i) buffer layer and an a-Si:H(p) emitter layer can then be applied.

The back-contacting of the Si thin-film solar cell according to the invention can be produced on the emitter layer using different means known from the prior art (see for example Stangl, R. et al.: "Planar rear emitter back contact amorphous/crystalline silicon heterojunction solar cells (RECASH/PRECASH)" in 33rd IEEE Photovoltaic Specialists Conference, San Diego, Calif., USA, May 11-16, 2008).

In a method according to an embodiment of the invention, a barrier layer having a layer thickness in the range of from 50 nm to 1 μm can be applied to a cleaned glass substrate. The material for the barrier layer is selected from $SiO_x$, $SiN_x$, $SiC_x$, $TiO_2$, $AlO_x$ or the mixed alloys thereof (for example: $Si_xO_yN$, $Si_xO_yC$), the barrier layer being formed as an individual layer or in multiple layers. Then, at least one layer which is intended for improving the optical characteristics and has a layer thickness of from 20 nm to 250 nm is applied to this barrier layer. $SiN_x$, $SiO_x$, $SiC_x$, $TiO_2$, $AlO_x$ or the mixed alloys thereof (for example: $Si_xO_yN$, $Si_xO_yC$) are used as the material for the coating layer. A 0.5 nm to 20 nm thin layer comprising silicon and/or oxygen is applied to the coating layer. An amorphous or nanocrystalline Si layer is deposited on this precursor layer, consisting for example of $SiO_x$, $SiN_x$, $SiN_xO_y$ or $Al_2O_3$, and a further layer, containing phosphorus or arsenic or antimony for example, is deposited on this amorphous or nanocrystalline Si layer as a doping source for the n-conductivity of the absorber layer. This further layer acting as a doping source can also be applied before the application of an amorphous or nanocrystalline Si layer. In both cases, the Si layer is then crystallized by means of a linear energy source by liquid-phase crystallization. During liquid-phase crystallization, a very thin $SiO_2$ passivation layer is produced between the precursor layer and the silicon absorber. When $SiN_x$ is used, the oxygen necessary for forming the $SiO_2$ passivation layer is introduced into the amorphous and/or nanocrystalline silicon layer by direct deposition. By means of the method according to the invention, an n-conducting crystalline Si absorber layer having a layer thickness of between 200 nm and 40 μm and having a homogeneous doping of between $2 \cdot 10^{15}$ $cm^{-3}$ and $5 \cdot 10^{18}$ $cm^{-3}$ over the entire thickness of the absorber layer is produced on this thin $SiO_2$ layer. In the production of this absorber layer, the method parameters are selected such that the monocrystalline Si grains in the absorber layer have an extension that is at least as great as the thickness of the absorber layer.

The homogeneous doping for the n-conductivity of the absorber layer can also be produced by in-situ doping during the deposition of the silicon layer, as is provided in a further method according to an embodiment of the invention. This can take place for example by constant doping during the deposition of an amorphous or nanocrystalline Si layer or also by local doping, i.e. by briefly adding aforementioned dopants at a specific location.

In embodiments, the doping concentration of the absorber layer can be produced in a range of from $1.5 \cdot 10^{16}$ $cm^{-3}$ to $2 \cdot 10^{18}$ $cm^{-3}$ or the doping concentration $N_D$ of the absorber layer can be set depending on its thickness using the formula $N_D = c_0 \cdot 1/d$, where d designates the thickness of the absorber layer in micrometers, which is of between 200 nm and 40 μm, and $c_0$ represents an areal doping, the value of which is in a range of between $6 \cdot 10^{17}$ $\mu m \cdot cm^{-3}$ and $8 \cdot 10^{18}$ $\mu m \cdot cm^{-3}$.

The surface of the n-conducting crystalline absorber layer produced in this way is subsequently cleaned, and an a-Si:H(i)-buffer layer and an a-Si:H(p) emitter layer are applied thereto. The back-contacting is produced, as already mentioned, using means known from the prior art. Methods for liquid-phase crystallization using a linear energy source are known and are described for example in DE 2012 004 314 A1 or in Solar Energy Materials & Solar Cells 123 (2014) 13-16 by Amkreutz et al.

In an embodiment, a 250 nm thick $SiO_x$ barrier layer is deposited on a glass substrate by means of reactive cathode sputtering. First of all, a $SiN_x$ coating layer having a thickness of 70 nm is applied to said barrier layer by means of reactive cathode sputtering. The layers can also be applied by means of chemical vapor deposition. A 20 nm thin $SiO_x$ layer is then applied by means of reactive cathode sputtering. A 10 μm thick nanocrystalline Si layer is deposited on said $SiO_x$ layer, and a phosphor-containing layer having a thickness of 2.5 nm is deposited on said nanocrystalline Si layer as a doping source. The Si layer is then crystallized by means of a linear energy source by liquid-phase crystallization. As a result, on this layer stack, a crystalline n-conducting absorber layer is produced which has a thickness of 10 μm, a doping concentration of $1·10^{17}$ $cm^{-3}$ and monocrystalline Si grains having a vertical extension of >10 μm. During the liquid-phase crystallization, a thin $SiO_2$ passivation layer, of just a few nm thick, is produced at the absorber layer/coating layer interface. Next, after wet chemical cleaning of the absorber layer, an a-Si:H(i)-buffer layer and an a-Si:H(p) emitter layer is applied, which is then provided with a back-contacting system, which is known from the prior art.

Figure 2:
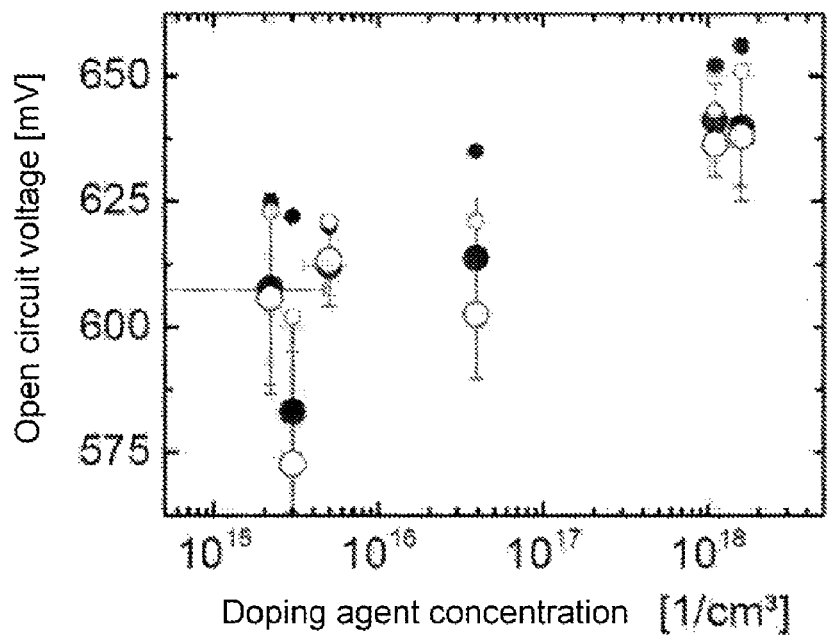
FIG. 2 depicts open circuit voltages for various doping concentrations of absorber layers according to embodiments of the invention.

The doping concentration of the absorber layer $N_D$ can be determined in a selected parameter range by the equation $$N_D = c_0 \cdot 1/d,$$

where d designates the thickness of the absorber layer, which is of between 200 nm and 40 μm, and $c_0$ represents an areal doping, the value of which is in a range of between $6·10^{17}$ μm·$cm^{-3}$ and $8·10^{18}$ μm $cm^{-3}$. Corresponding parameter ranges are shown in FIG. 1. Measurements have confirmed that back-contact solar cells according to an embodiment of the invention have open circuit voltages above 625 mV when the stated parameters are adhered to. This result is shown in FIG. 2.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A back-contact Si thin-film solar cell, comprising:
a crystalline Si absorber layer and an emitter layer arranged on the crystalline Si absorber layer, the layers including semiconductor materials of opposite p- and n-type doping, a contact system being arranged on a back thereof so as to collect excess charge carriers generated by the incidence of light in the absorber layer,
a barrier layer having a layer thickness in a range of from 50 nm to 1 μm formed on a glass substrate,
at least one coating layer intended for optical coating having a layer thickness of 40 nm to 250 nm arranged on the barrier layer,
a 0.5 nm to 20 nm thin layer containing silicon and/or oxygen adjoining the crystalline Si absorber layer arranged on the at least one coating layer for improving the optical characteristics, and
an $SiO_2$ passivation layer formed between the 0.5 nm to 20 nm thin layer containing silicon and/or oxygen and the Si absorber layer,
wherein the crystalline Si absorber layer is produced by liquid-phase crystallization, is n-conducting, has a layer thickness of between 200 nm and 40 μm, has homogenous doping of between $2·10^{15}$ cm−3 and $5·10^{18}$ cm−3 over an entire thickness thereof, and has monocrystalline Si grains, an extension thereof being at least as great as the thickness of the absorber layer.

2. The back-contact Si thin-film solar cell according to claim 1, wherein the barrier layer is formed of $SiO_x$, $SiN_x$, $SiC_x$, $TiO_2$, $AlO_x$ or the mixed alloys thereof as an individual layer or in multiple layers.

3. The back-contact Si thin-film solar cell according to claim 1, wherein the at least one coating layer intended for optical coating is formed of $SiN_x$, $SiO_x$, $SiC_x$, $TiO_2$, $AlO_x$ or the mixed alloys thereof.

4. The back-contact Si thin-film solar cell according to claim 1, wherein the homogeneous doping of the n-conducting crystalline Si absorber layer is $1.5·10^{16}$ cm−3 to $2·10^{18}$ cm−3 over the entire thickness thereof.

5. The back-contact Si thin-film solar cell according to claim 1, wherein the homogeneous doping of the n-conducting crystalline Si absorber layer is determined according to the formula $N_D = c_0 \cdot 1/d$, where d designates the thickness of the absorber layer in micrometers, which is of between 200 nm and 40 μm, and $c_0$ represents an areal doping, the value of which is in a range of between $6·10^{17}$ μm·cm−3 and $8·10^{18}$ μm·cm−3.

6. The back-contact Si thin-film solar cell according to claim 1, further comprising an intrinsically conductive passivation layer disposed between the absorber layer and the emitter layer.

7. The back-contact Si thin-film solar cell according to claim 1, wherein the barrier layer includes $SiO_x$.

8. The back contact Si thin-film solar cell according to claim 1, wherein the at least one coating layer intended for optical coating includes $SiN_x$.

9. The back-contact Si thin-film solar cell according to claim 1, wherein the 0.5 nm to 20 nm thin layer containing silicon and/or oxygen includes $SiO_x$.

10. The back contact Si thin-film solar cell according to claim 1, wherein the extension of the monocrystalline Si grains is greater than 10 μm.

* * * * *